(12) United States Patent
Iranmanesh

(10) Patent No.: US 6,432,726 B2
(45) Date of Patent: *Aug. 13, 2002

(54) METHOD AND APPARATUS FOR REDUCING PROCESS-INDUCED CHARGE BUILDUP

(75) Inventor: Ali Akbar Iranmanesh, Sunnyvale, CA (US)

(73) Assignee: Artisan Components, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/829,772

(22) Filed: Mar. 31, 1997

(51) Int. Cl.[7] ............................................. H01L 21/00
(52) U.S. Cl. ........................................ 438/4; 438/281
(58) Field of Search ..................... 438/281, 4, 215, 438/612, 622

(56) References Cited

U.S. PATENT DOCUMENTS

| | | | | |
|---|---|---|---|---|
| 4,612,629 A | * | 9/1986 | Harai | 365/185 |
| 5,621,229 A | * | 4/1997 | Huang | 257/212 |
| 5,760,445 A | * | 6/1998 | Diaz | 257/356 |
| 5,811,869 A | * | 9/1998 | Seyyedy et al. | 257/530 |
| 5,817,577 A | * | 10/1998 | Ko | 438/694 |
| 5,844,258 A | * | 12/1998 | Oh | 257/139 |
| 5,883,401 A | * | 3/1999 | Pezzani | 257/121 |
| 5,903,031 A | * | 5/1999 | Yamada et al. | 257/356 |
| 5,910,452 A | * | 6/1999 | Kang et al. | 438/710 |
| 6,093,626 A | * | 7/2000 | Su et al. | 438/532 |

OTHER PUBLICATIONS

Wolf, "Silicon Processing for the VLSI Era vol. 2: Process Integration", Lattice Press, 1990, pp. 332–333.*

* cited by examiner

Primary Examiner—Richard Booth
(74) Attorney, Agent, or Firm—Martine & Penilla, LLP

(57) ABSTRACT

Method and apparatus are disclosed for protection of a circuit against process-induced electrical discharge. The method includes forming a diode in close proximity to a charge collector structure capable of exhibiting the antenna effect, and connecting the diode to the charge collector structure by means of local interconnect techniques during intermediate processing steps. Additionally, the diode may be formed beneath a connecting pad to reduce or eliminate antenna effect problems without significant loss of die area.

7 Claims, 3 Drawing Sheets

METHOD AND APPARATUS FOR REDUCING PROCESS-INDUCED CHARGE BUILDUP

FIELD OF THE INVENTION

This application relates to methods and apparatus for reduction of charge collection in semiconductor processing; and more particularly relates to the reduction of damage caused by process-induced charge collection in cell based arrays.

BACKGROUND OF THE INVENTION

It has become well known that certain processes used in semiconductor fabrication can induce collection of charge in some polysilicon or metal structures during the fabrication of a semiconductor device. More specifically, use of a plasma ambient during processing has been shown to induce charge in polysilicon or metal structures sometimes referred to as "antenna" or "charge collector" structures. This collection of charge has been shown capable of causing damage to thin gate oxides in at least some instances, and thus to reduce yield significantly. The problem is exacerbated as critical device dimensions are reduced, for example one-quarter m, with the concomitant reduction in the thickness of gate oxides to, for example, ten nm or less, and in at least some instances on the order of seven nanometers.

The damage possible from such processing steps has been described in the literature. One article, entitled "Plasma-Parameter Dependence of Thin-Oxide Damage from Wafer Charging During Electron-Cyclotron-Resonance Plasma Processing" is found in the February 1997 issue of *IEEE Transactions on Semiconductor Manufacturing*, Vol. 10, No. 1, p. 154. A related article, entitled "Plasma Etching Charge-Up Damage to Thin Oxides," can be found in the August 1993 issue of *Solid State Technology*, at page 29. Both articles make clear that process-induced present significant risks to yields.

Although the adverse results due to the antenna effect are well known in the current art, it is much less certain how best to counteract the problem. Although a diode has been mentioned abstractly in the literature, no successful implementation has been demonstrated. More particularly, the implementation of a diode has heretofore involved significant loss of area. This loss of area makes implementation of a diode substantially less desirable, since die area is critical to modern complex designs.

There has therefore been a need to develop a circuit design which minimizes or eliminates the antenna effect while at the same time minimizing the mount of area lost.

SUMMARY OF THE INVENTION

The present invention substantially overcomes the limitations of the prior art by providing an extremely compact structure which dissipates charge collected during processing steps of semiconductor structures. The present invention is particularly suited to cell-based arrays, although it is also suited to other semiconductor devices.

In particular, the present invention involves modification of the fabrication process to include providing a means for discharging the charge-collection structures identified in the prior art, while at the same time minimizing the amount of die area needed to achieve such results. More specifically, for a substrate of a first type, an area of a second type is deposited in a location suitable for connection to a charge collection structure to be fabricated in subsequent steps. The charge collector structure may be, for example, a polysilicon or metal run connected to a first gate and intended ultimately to connect to other structures, but left unconnected for a portion of the processing steps.

The combination of a substrate of a first type and a deposition area of a second type can be seen to create a diode. By positioning the diode in close proximity to the charge collector structure, the two structures may be connected by means of any of a plurality of local interconnect techniques. The diode permits charge to be dissipated during processing, but essentially has negligible effect on the operation of the finally-constructed circuit. In this way the antenna effect is minimized or eliminated, and yield is improved.

In a presently preferred embodiment, the diode of the present invention is placed in a location which will eventually be a connecting pad. In this manner, substantially the entire die area may be utilized for semiconductor structures implementing the overall circuit, while at the same time eliminating the antenna effect. The invention is particularly well-suited to complex integrated circuits such as cell-based arrays, but may be successfully implemented in a wide variety of circuit designs.

The present invention will be better understood from the following Detailed Description of the Invention, taken together with the appended drawings. Although the invention is explained in the context of a cell-based array, it is to be understood that such an embodiment is exemplary only and not limiting.

FIGURES

DETAILED DESCRIPTION OF THE INVENTION

Figure 1:
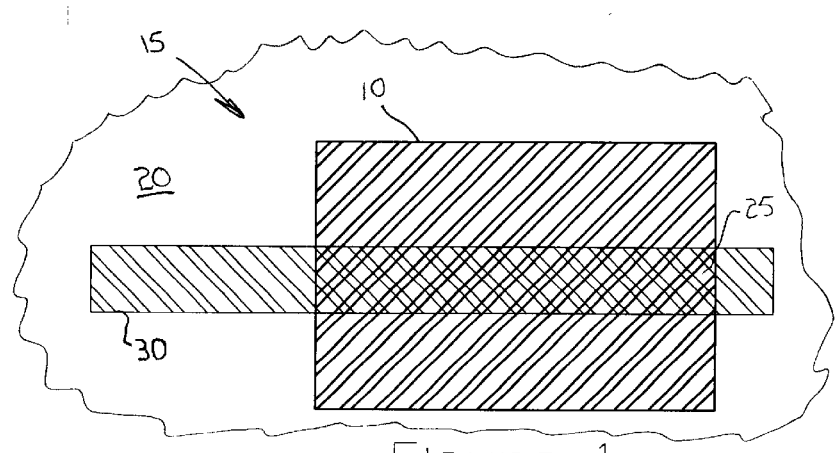
FIG. 1 shows a transistor structure in which a gate is formed over an active area.

Referring first to FIG. 1, an active area 10 of a field effect transistor shown generally as 15 is shown positioned on a substrate 20. In a typical embodiment, the substrate 20 is formed of p-type silicon, while the active area 10 is formed by n+ implantation. As will be appreciated by those skilled in the art and shown in FIG. 4 (discussed hereinafter), overlying the active area 10 is a thin gate structure 25 connecting a source and a drain. The gate structure 25 will, in many embodiments, essential bisect the active area 10 and is formed of a thin oxide. The thickness of the gate oxide may be less than 10 nm, and in at least some embodiments may be on the order of 7 nm.

Overlying the gate structure 25 is, in an exemplary embodiment, a connecting structure 30 for connecting the gate 20 of the transistor 15 to other structures in the circuit, for example other transistors. The connecting structure 30 is, in an exemplary embodiment, formed of polysilicon, although metal may also be used for such connecting structures. The connecting structure 30 may extend across multiple transistors and represents a relatively long run, thus providing the possibility of collection of charge during intermediate processing steps of the device. This collection of charge is commonly referred to as the antenna effect.

Figure 2:
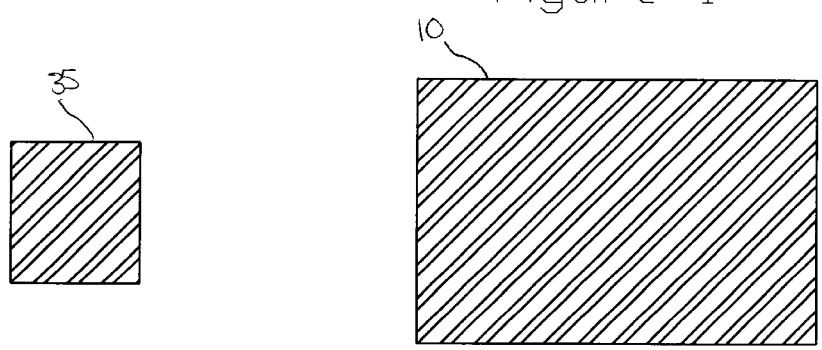
FIG. 2 shows an implanted area positioned sufficiently near the transistor structure of FIG. 1 to minimize the antenna effect.
Figure 3A:
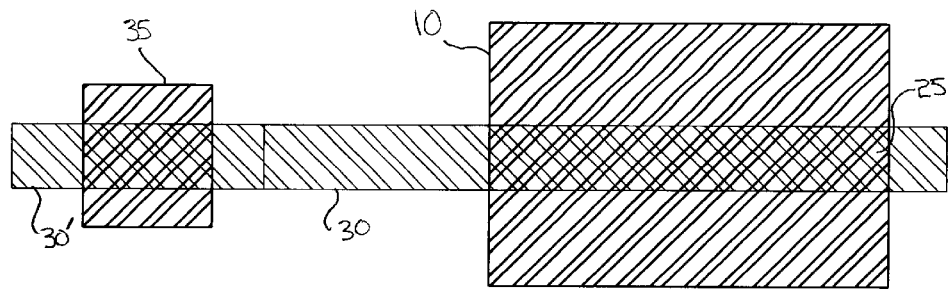
FIG. 3A shows a first arrangement for connection of the implanted area to the transistor structure.
Figure 3B:
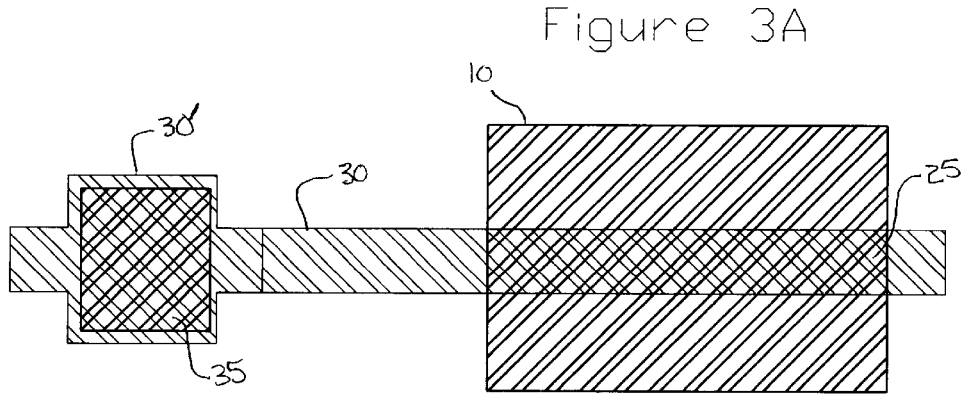
FIG. 3B shows an alternative arrangement for connection of the implanted area to the transistor structure.

Referring next to FIGS. 2, 3A and 3B, the charge dissipation structure of the present invention may be better appreciated. FIGS. 2, 3A and 3B show in plan view the new charge dissipation structure both before connection to the polysilicon (FIG. 2) and after (FIGS. 3A and 3B). In particular, an n+ area 35 (still assuming the substrate is p-type) is formed along the anticipated run of structure 30 at a point suitably close to the transistor 15 to dissipate any charge buildup on the structure 30 which might endanger the gate oxide 25. The formation of this structure 35 must occur in the proper sequence during fabrication of the overall circuit of which transistor 15 is a part. In an exemplary embodiment, the relevant processing steps can be described generally as follows, with particular reference to FIGS. 3A–3B: the active areas 10 are formed initially, followed by formation of n-wells (for PMOS) and p-wells (for NMOS) which form the protection structures 35 of the present invention. Gate oxide is then formed, followed by removing the gate oxide from the structures 35. The layer of polysilicon 30 is then deposited and doped to n+ conductivity, after which patterning and etching is completed. In a feature which is important in at least some embodiments, the structure 35 is positioned to minimize the impact of the present invention on the die area available for the intended circuit, and is connected to the gate 25 through a local interconnect portion 30' which at least abuts the polysilicon 30. To accomplish this, the structure 35 may, for example, be formed at a location which will, when processing is completed, be directly beneath a connecting pad. This can be particularly appreciated from FIG. 3B, wherein the polysilicon is essentially congruent with the structure 35. The polysilicon need not cover the entire structure 35, as shown in FIG. 3A, and the polysilicon may be smaller or larger than the structure 35 with the primary goal being an optimization of reliability together with minimum wastage of the die area. Other locations will be acceptable in at least some embodiments, such as directly beneath the run 30, for example is an open area not otherwise utilized by the circuit design.

Figure 4:
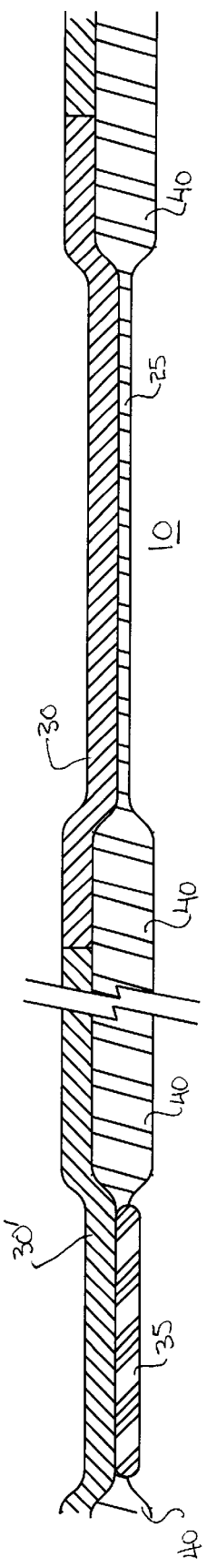
FIG. 4 shows, in cross-section, a first form of local interconnect for connecting the implanted area to the charge collector structure.

Referring particularly to the cross-sectional view of FIG. 4, a first embodiment for connecting the structure 35, which is an n-well in this example, to the gate through a local interconnect technique. In particular, the active area 10 is shown in the p-type substrate 20. Field oxide 40 is shown to isolate the active area 10 from an n-well 35, with the actual distance between the two being determined by the circuit layout. A gate oxide 25 is grown over the active area 10 and n-well 35 by conventional processing steps. The oxide 25 is then removed from the n-well 35, after which the polysilicon structure 30 is laid down over the gate oxide 25 and also connected to the n-well 35 by any suitable local interconnect technique, again indicated at 30'. The local interconnect may include extending the polysilicon run over the n-well 35. As noted previously, thereafter the polysilicon 30 is typically doped n+ in an exemplary arrangement, and then patterned and etched by conventional methods. The polysilicon 30 can thus be seen to connect to the n+ implant 35, thereby cooperating with the p-type substrate to form a diode for dissipation of charge from the polysilicon 30 until additional processing steps connect the polysilicon 30 to other transistor structures in the circuit.

It will be appreciated that, while the simplified fabrication process described herein in connection with FIG. 4 requires additional processing steps, it provides protection against charge buildup even during the step of etching the polysilicon. It will also be appreciated that, if the configuration of FIG. 3B is used, the step of doping the polysilicon 30 to n+ will also dope the structure 35 to n+.

Figure 5:
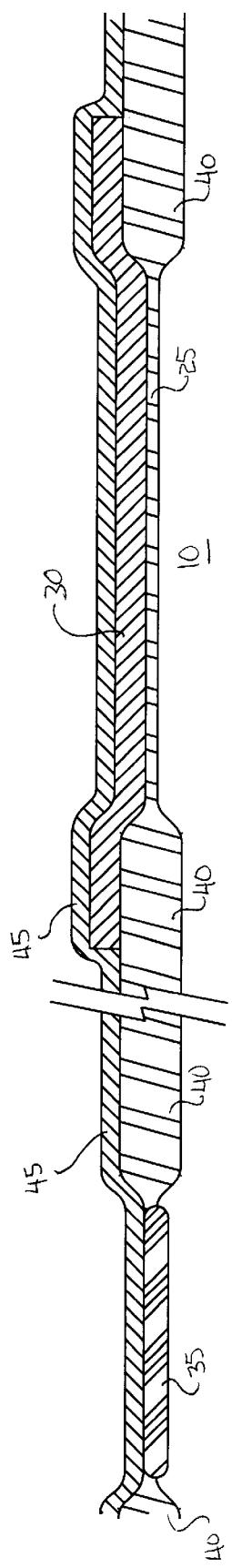
FIG. 5 shows in cross-section a second form of local interconnect for connecting the implanted area to the charge collector structure.
Figure 6:
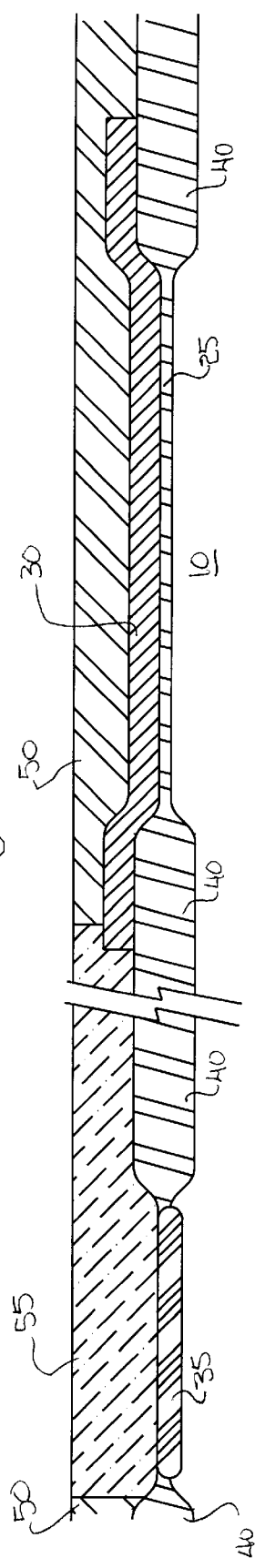
FIG. 6 shows in cross-section a variation on the local interconnect technique shown in FIG. 5.

Referring next to FIGS. 5 and 6, a second local interconnect technique is described for connecting the n-well 35 to the polysilicon 30. In particular, FIG. 5A shows the essential structure prior to addition of the local interconnect, including the substrate 15, active area 10, gate oxide 25, n well 35 and field oxide 40, with the polysilicon 30 extending over the gate oxide 25 in a conventional manner. As noted previously in connection with FIG. 4, the polysilicon gate structure 30 and n+ diode area 35 have both been patterned and formed. However, unlike FIG. 4, for the structure in FIG. 5 the polysilicon 30 is used only to form the gate. Thereafter, a layer of titanium silicide is shown formed over both the polysilicon 30 and the n well 35, thereby forming a local interconnection for dissipation of charge on the polysilicon 30. The formation of the titanium silicide actually occurs in multiple steps including, for example, the deposition of a layer of titanium and —Si, followed by an anneal step to form the titanium silicide. This technique permits construction of the protection diode with no extra mask steps. However, this technique suffers from the disadvantage that no charge dissipation is provided during the step of etching the polysilicon.

FIG. 6 shows a variation on the technique of FIG. 5, in which an oxide layer 50 is grown over the entire structure (instead of titanium silicide), including the n well 35 and polysilicon 30. The polysilicon 30 is again used only to form the gate structure. The oxide 50 is then etched in a subsequent step to uncover both the n-well 35 and an adjacent portion of the polysilicon 30. Thereafter, a deposition of aluminum or other connective material 55 is made over the n-well 35 and the uncovered portion of the polysilicon 30. Again, while this technique need not require additional mask steps, it does not provide charge dissipation during the polysilicon etch step.

Figure 7:
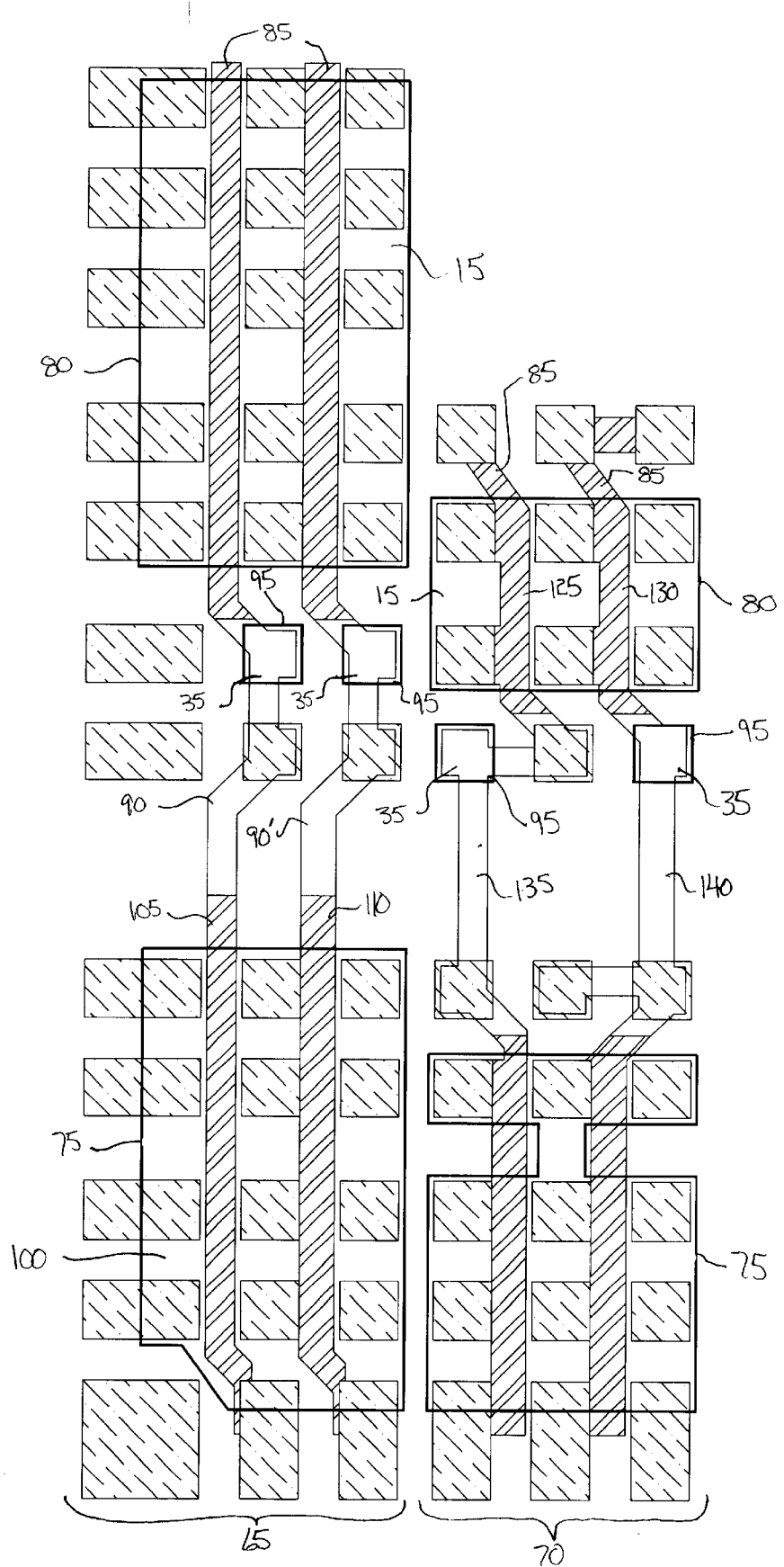
FIG. 7 shows in plan view the implementation of the present invention in he drive and compute cells of a cell-based array.

Referring next to FIG. 7, the charge protection diode of the present invention is shown (in simplified form) implemented in the compute and drive cells of a cell-based array. In particular, a drive cell 65 is shown on the left, while a compute cell 70 is shown on the right. A lower section 75 of both the drive and compute cells is fabricated in PMOS, while an upper section 80 of both cells is fabricated in NMOS. It will be appreciated that various connecting structures have been simplified for clarity.

Referring first to the NMOS portion 80 of the drive cell 65, a plurality of transistors 15 can be seen to be formed with shared polysilicon gates 85. The polysilicon gates 85 can be seen to extend nearly to n+ wells 35, and connected thereto by local interconnect portions 90 and 90'. In a typical arrangement, the n+ wells 35, which cooperate with the substrate 20 to form the diodes of the present invention, are located underneath subsequently-formed pads 95. The PMOS portion 75 of the drive cell 65 can be seen to include a similar transistor structure 100 with shared polysilicon gates 105 and 110, and can be seen to be similarly connected via local interconnects 90 and 90' to the diodes formed at the n+ wells 35 beneath the pads 95.

Similarly, in the NMOS portion 80 of the compute cell 70, a pair of diode structures 35 are shown formed in close proximity to polysilicon runs 125 and 130, and connected thereto by local interconnect portions 135 and 140. As before, pads 95 are formed in subsequent steps atop the n+ wells 35. Likewise, in the PMOS portion 75 of the compute cell 70, transistors 160 include shared gates 165 and 170. The polysilicon runs which are formed over the gate oxides 25 extend to the same local interconnect portions 135 and 140 as the NMOS portion 80, and thus connect to the n-wells 35. It will be understood that, in a presently preferred arrangement, the polysilicon runs overlying each gate oxide typically will be connected to a charge dissipation structure 35 to minimize the risks associated with process-induced collection of charge, thereby improving yield and process reliability. It will also be appreciated that, by placing the structures 35 in the same location as pads will subsequently be placed, substantially no die area is wasted. The present invention can therefore be seen to be an efficient, cost-effective and flexible method of improving yield while maintaining high circuit densities.

From the foregoing, it can be appreciated that a new and novel technique for reducing or eliminating the antenna effect has been disclosed. The technique also has the advantage of preserving a maximum amount of the die area for implementation of the circuit design. Having fully described one embodiment of the present invention, it will be apparent to those of ordinary skill in the art that numerous alternatives and equivalents exist which do not depart from the invention set forth above. It is therefore to be understood that the invention is not to be limited by the foregoing description, but only by the appended claims.

What is claimed is:

1. A method for dissipation of process-induced charge during semiconductor fabrication, comprising:

establishing, in a substrate of a first conductivity, an active area;

establishing, in the substrate, a well of a second conductivity in proximity to the expected location of a gate structure; and forming a polysilicon layer directly over the active area and the well to define a polysilicon structure of the second conductivity, the polysilicon structure extending between the active area to at least a portion of the well.

2. A method, comprising:

establishing, in a substrate of a first conductivity, an active area;

establishing, in the substrate, a well of a second conductivity in proximity to an expected location of a gate electrode, the gate electrode of the second conductivity;

forming directly over the active area and the well the gate electrode of the second conductivity, the gate electrode extending between the active area to at least a portion of the well; and locating a connecting pad at least partially over the well of the second conductivity, whereby the antenna effect is minimized during semiconductor fabrication.

3. The method of claim 1 further comprising:

forming an oxide over at least a portion of the gate structure;

etching away at least a portion of the oxide from the well; and depositing a conductive layer connecting the well of the second conductivity to the gate structure.

4. The method of claim 1 further including connecting each gate structure to a separate well of the second conductivity.

5. The method of claim 4 further including placing each well of the second conductivity substantially beneath a connecting pad.

6. The method of claim 1, wherein the polysilicon structure is configured to dissipate a charge as soon as the polysilicon structure is formed.

7. The method of claim 2, wherein the gate electrode is configured to dissipate a charge as soon as the gate electrode is formed.

* * * * *